(12) United States Patent
Zhou et al.

(10) Patent No.: US 10,157,817 B1
(45) Date of Patent: Dec. 18, 2018

(54) CHIP-SCALE COOLING DEVICE HAVING THROUGH-SILICON VIAS AND FLOW DIRECTING FEATURES

(71) Applicant: Toyota Motor Engineering & Manufacturing North America, Inc., Erlanger, KY (US)

(72) Inventors: Feng Zhou, South Lyon, MI (US); Ercan M. Dede, Ann Arbor, MI (US)

(73) Assignee: TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 0 days.

(21) Appl. No.: 15/881,443

(22) Filed: Jan. 26, 2018

(51) Int. Cl.
  *H01L 23/433* (2006.01)
  *H01L 23/498* (2006.01)
  *H01L 21/48* (2006.01)
  *H01L 23/495* (2006.01)
  *H01L 23/427* (2006.01)

(52) U.S. Cl.
  CPC ........ *H01L 23/4336* (2013.01); *H01L 21/486* (2013.01); *H01L 21/4857* (2013.01); *H01L 23/427* (2013.01); *H01L 23/49534* (2013.01); *H01L 23/49827* (2013.01); *H01L 23/49838* (2013.01)

(58) Field of Classification Search
  CPC ... H01L 23/46; H01L 23/473; H01L 23/4336; H01L 23/4735
  USPC .................................................. 361/699, 702
  See application file for complete search history.

(56) References Cited

U.S. PATENT DOCUMENTS 8,546,930 B2 10/2013 Bakir et al.
8,828,797 B2 9/2014 Coudrain et al.
8,883,637 B2 11/2014 Jeng et al.
(Continued)

FOREIGN PATENT DOCUMENTS

CN 101834159 B 8/2012
JP 6119352 B2 4/2017

OTHER PUBLICATIONS

Dede, E. M. et al., Concepts for embedded cooling of vertical current wide band-gap semiconductor devices. in 2017 16th IEEE Intersociety Conference on Thermal and Thermomechanical Phenomena in Electronic Systems (ITherm). 2017.
(Continued)

Primary Examiner — David Vu
Assistant Examiner — Brandon Fox
(74) Attorney, Agent, or Firm — Dinsmore & Shohl LLP

(57) ABSTRACT

A cooling structure includes a first substrate layer including an array of cooling channels, a second substrate layer including a nozzle structure, an outlet manifold, and an outlet, a third substrate layer including an inlet, and inlet manifold, and one or more flow directing features are disposed within the inlet manifold. The one or more flow directing features include one or more micro-pillars extending into the cooling fluid flow path from the inlet manifold, the first substrate layer includes one or more first substrate layer through-holes, the second substrate layer includes one or more second substrate layer-through holes, and the third substrate layer includes one or more third-substrate layer through holes. The first substrate layer through-holes, the second substrate layer through-holes, and the third substrate layer through-holes are aligned into one or more TSVs and metallized.

20 Claims, 5 Drawing Sheets

(56) References Cited

U.S. PATENT DOCUMENTS

| | | | |
|---|---|---|---|
| 8,970,050 B2 | 3/2015 | Lee | |
| 9,355,933 B2 | 5/2016 | Ching et al. | |
| 9,659,838 B1* | 5/2017 | Harris | H01L 23/46 |
| 9,666,523 B2 | 5/2017 | Wood | |
| 9,754,921 B2 | 9/2017 | Park et al. | |
| 2011/0215457 A1 | 9/2011 | Park | |
| 2011/0304979 A1* | 12/2011 | Peterson | G06F 1/20 |
| | | | 361/679.47 |
| 2012/0212907 A1* | 8/2012 | Dede | H01L 23/4735 |
| | | | 361/702 |
| 2014/0030900 A1* | 1/2014 | Leigh | H01L 23/4006 |
| | | | 439/196 |
| 2015/0348869 A1* | 12/2015 | Joshi | H01L 23/4735 |
| | | | 361/700 |

OTHER PUBLICATIONS

Gambino, J.P., Adderly, S.A., and Knickerbocker, J.U., An overview of through-silicon-via technology and manufacturing challenges. Microelectronic Engineering, 2015. 135: p. 73-106.

Green, et al., A Review of Two-Phase Forced Cooling in Three-Dimensional Stacked Electronics: Technology Integration; http://electronicpackaging.asmedigitalcollection.asme.org/article.aspx?articleid=2469021, 2015, 9 pages.

* cited by examiner

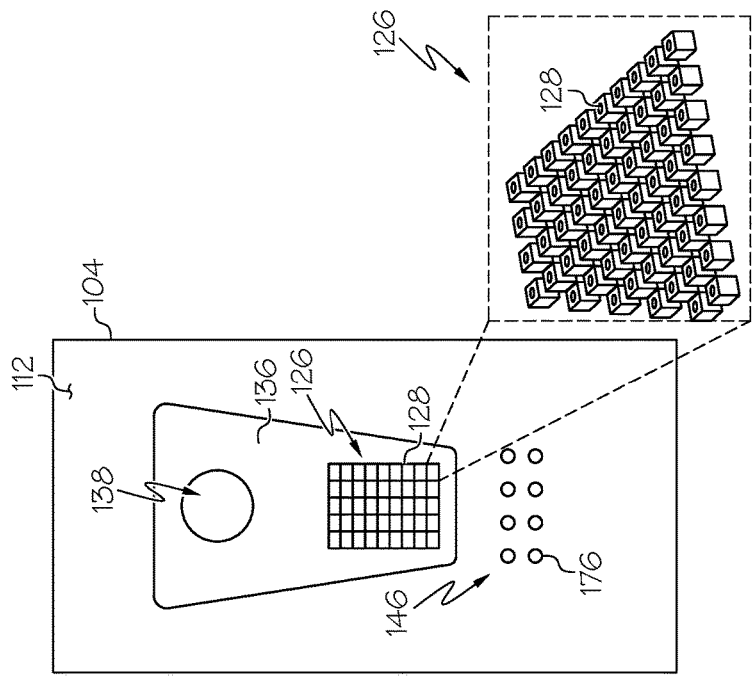
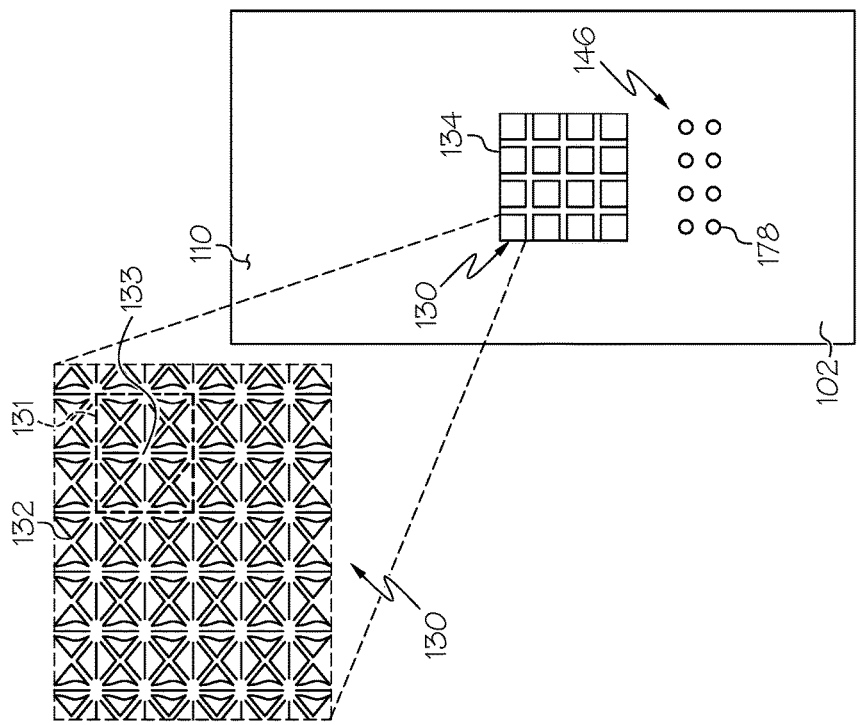
FIG. 2A
FIG. 2B

CHIP-SCALE COOLING DEVICE HAVING THROUGH-SILICON VIAS AND FLOW DIRECTING FEATURES

TECHNICAL FIELD

The present specification generally relates to chip-scale cooling devices for cooling semiconductor devices and, more specifically, to chip-scale cooling devices having through-silicon vias.

BACKGROUND

Power semiconductor devices may generate large amounts of heat from operational losses. This heat should be removed to avoid malfunction of the device or other components. One way to remove heat from a heat generating device is with a heat removal system, such as, for example a cooling fluid system. Generally, the closer to the heat generating device the cooling fluid flows, the more efficiently the cooling fluid will remove heat from the heat generating device. However, conventional heat removal systems may not adequately remove heat flux from the semiconductor device.

SUMMARY

In one embodiment, a cooling structure includes a first substrate layer including an array of cooling channels, a second substrate layer including a nozzle structure, an outlet manifold, and an outlet, a third substrate layer including an inlet, and inlet manifold, and one or more flow directing features are disposed within the inlet manifold. The one or more flow directing features include one or more micro-pillars extending into the cooling fluid flow path from the inlet manifold, the first substrate layer includes one or more first substrate layer through-holes, the second substrate layer includes one or more second substrate layer-through holes, and the third substrate layer includes one or more third-substrate layer through holes. The first substrate layer through-holes, the second substrate layer through-holes, and the third substrate layer through-holes are aligned into one or more TSVs and metallized.

In another embodiment, a cooling structure includes a first substrate layer comprising an array of cooling channels, a second substrate layer comprising a nozzle structure, an outlet manifold, and an outlet, a third substrate layer comprising an inlet, and inlet manifold, and one or more flow directing features disposed within the inlet manifold. The one or more flow directing features comprise one or more micro-pillars extending into the cooling fluid flow path from the inlet manifold, the first substrate layer comprises one or more first substrate layer through-holes, the second substrate layer comprises one or more second substrate layer-through holes, and the third substrate layer comprises one or more third-substrate layer through holes. The first substrate layer through-holes, the second substrate layer through-holes, and the third substrate layer through-holes are aligned into one or more TSVs and metallized.

In yet another embodiment, a cooling structure includes a first substrate layer comprising a top surface and a bottom surface, an array of cooling channels and a cooling fluid drain disposed on the bottom surface, and one or more first substrate layer through-holes, a second substrate layer comprising a top surface and a bottom surface, a nozzle structure and an outlet manifold disposed on the top surface, an outlet, and one or more second substrate layer through-holes, and a third substrate layer comprising a top surface and a bottom surface, an inlet manifold and one or more flow directing features disposed within the inlet manifold disposed on the top surface, and an inlet and one or more third substrate layer through-holes. The first substrate layer through-holes, second substrate layer through-holes, and third substrate layer through-holes form one or more TSVs through the first, second, and third substrate layers, one or more electrically conductive materials are disposed within the one or more TSVs, the one or more third substrate layer through-holes are disposed in the one or more flow directing features in the inlet manifold, and the one or more flow directing features comprise one or more micro-pillars.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

FIG. 2A depicts a bottom surface of a first substrate layer of the cooling structure of FIG. 1, according to one or more embodiments shown and described herein;

FIG. 2B depicts a top surface of a second substrate layer of the cooling structure of FIG. 1, according to one or more embodiments shown and described herein;

DETAILED DESCRIPTION

Figure 1:
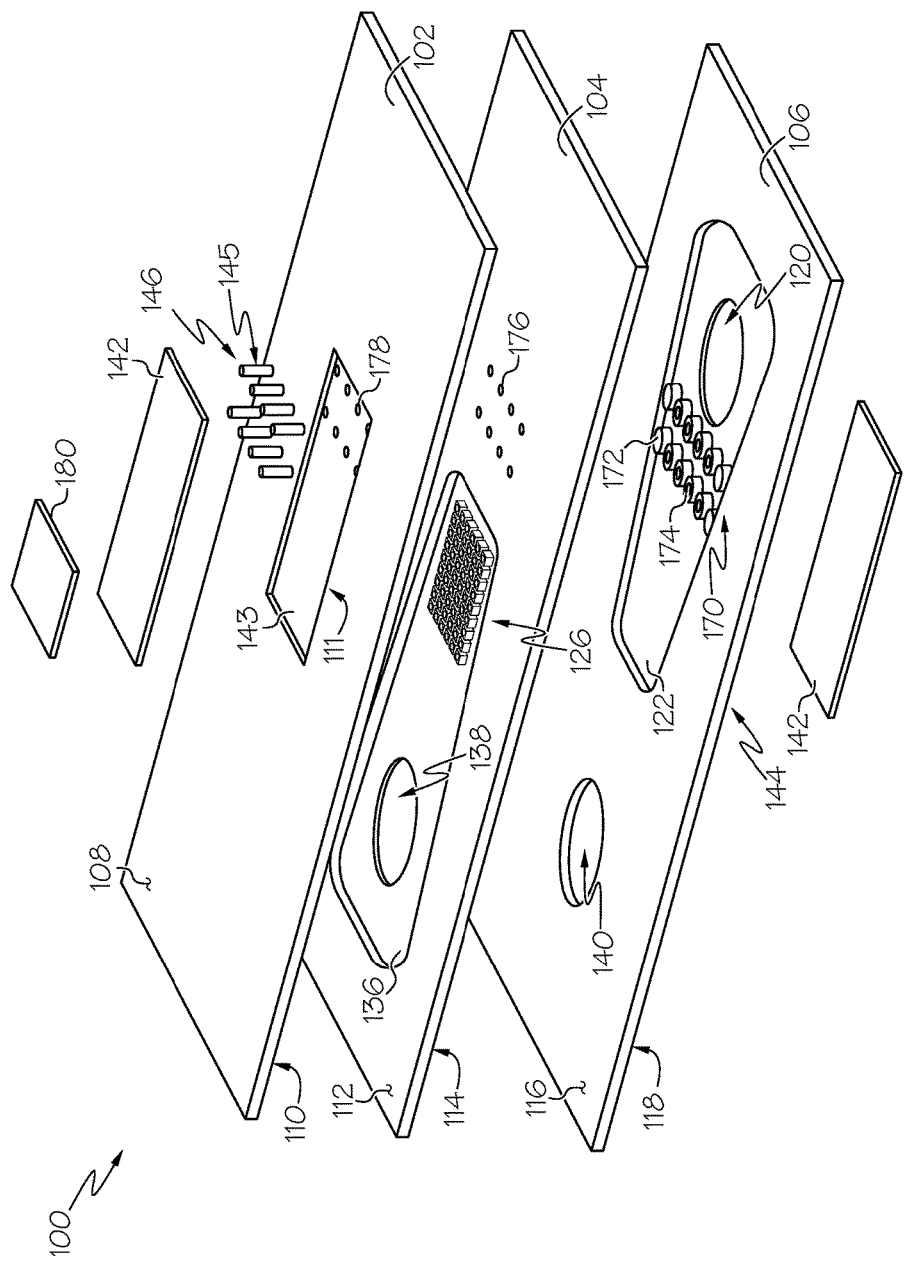
FIG. 1 depicts an exploded schematic view of a cooling structure including a flow directing feature and one or more TSVs, according to one or more embodiments shown and described herein.

Power semiconductor devices, such as diodes, switches, and amplifiers generate large amounts of heat during operation. Power semiconductor devices, particularly SiC and GaN devices, may switch relatively high levels of current on and off at a high speeds and generate large amounts of heat due to operational losses. Accordingly, large amounts of heat should be removed from the devices during operation.

Embodiments described herein may integrate a power semiconductor into a chip-scale cooling device comprised of one or more layers of silicon. Heat reduction of the power semiconductor device may be accomplished using one or more heat removal features, such as arrays of cooling channels and cooling fluid flow to conduct heat away from the semiconductor device or other heat generating device. The nearer these features are located to the heat generating, power semiconductor device, the more efficiently they will remove heat. For example, one or more extensions of thermally conductive materials may project from the heat generating device and into the flow of the cooling fluid to convect heat to the flowing fluid. Even more, one or more nozzle structures may impinge fluid onto the array of cooling channels. The cooling fluid may even change phase as it passes through the nozzle to remove an even greater quantity of heat from the heat generating device. It is noted that the concepts described herein may be used to cool any type of semiconductor device and are not limited to power semiconductor devices.

Additionally, electrical connections may be desired between the various layers of the semiconductor device and the cooling structure (e.g., positive and negative connections). Vertical integration between the multiple layers may be accomplished by etching one or more holes in the various layers to form one or more vertical interconnect accesses through the various layers ("through-silicon vias" or simply "TSVs"). The TSVs may be made electrically conductive. As an example and not a limitation, a TSV may be formed by etching a hole through one or more layers of silicon layer, coating the surfaces of the hole with an insulating layer, coating the insulating layer with a diffusion barrier layer, and filling the hole with a conductive metal, such as, without limitation, copper or tungsten. The holes in the silicon layers may be formed prior to stacking the layers, after the layers have been stacked into a three-dimensional array, or some combination of the two. TSVs may be used to pass electrical signals and/or current between dies through one or more components of a device package.

Depending on the flow characteristics of a specific package, it may advantageous to have TSVs inside or outside of the cooling fluid flow path. Accordingly, in some embodiments, the TSVs may be placed in the cooling fluid flow path for one or more reasons, such as, for example, shaping the flow of cooling fluid through the various features of the device. For example, current chip-scale devices may experience cooling fluid flow that is imbalanced leading to an uneven temperature distribution across a semiconductor device's thermal profile. Uneven temperature distribution across the device may result in one or more hotspots. Hotspots may affect device performance immediately or lead to breakdown over the course of the device's useable life. For example, the velocity of the cooling fluid flow may be too high and cooling fluid may be forced to one or more sectors of a nozzle structure at the expense of other sectors. Hence, a cooling structure having a flow directing feature for balancing the flow within a cooling fluid flow path may be required.

Referring now to FIG. 1, an example cooling structure 100 having one or more electrically conductive materials 145 disposed in one or more TSVs 146 disposed in one or more flow directing features 170 is shown. The cooling structure 100 shown in FIG. 1 is merely an example and alternative embodiments are possible. The cooling structure 100 includes features that provide a cooling fluid flow path 101. The cooling structure 100 may include a first substrate layer 102, a second substrate layer 104, and a third substrate layer 106. In embodiments, the first, second, and third substrate layers 102, 104, and 106 are fabricated from silicon. The first substrate layer 102 may include a top surface 108 and a bottom surface 110. In the illustrated embodiment, a metallization trench 143 is provided in the top surface 108 of the first substrate layer 102. A metallization pad 142 is disposed within the metallization trench 143. The top metallization trench 143 may be etched into the top surface 108 for receiving the metallization pad 142. As described in more detail below, the metallization pad 142 electrically couples a bottom surface of the one or more semiconductor devices 180 to one or more TSVs 146 disposed through the metallization trench 143. The metallization pad 142 may be fabricated from an electrically conductive material such as, without limitation, copper. The one or more semiconductor devices 180 are disposed on the metallization pad 142.

The one or more semiconductor devices 180 may comprise a semiconductor material, for example, silicon, or a wide bandgap semiconductor material, such as, for example, SiC, GaN, or the like. In some embodiments, the semiconductor device may comprise an insulated-gate bi-polar transistor ("IGBT"), a metal-oxide-semiconductor field-effect transistor ("MOSFET") or any other semiconductor device. Further, as a non-limiting example, the semiconductor device 180 may operate at temperatures between about 250° C. and about 350° C. It should be understood that this range is only exemplary and that other die operation temperatures are possible. As an example and not a limitation, the semiconductor device 180 may be used in an inverter circuit, such as, for example in an inverter circuit of an electrified vehicle.

Referring to FIGS. 1 and 2A, an array 130 of cooling channels 132 may be disposed on the bottom surface 110 of the first substrate layer 102. The array 130 of cooling channels 132 is disposed on a bottom surface 110 of the first substrate layer 102. The array 130 of cooling channels 132 may be positioned opposite a nozzle structure 126 that includes a plurality of nozzles 128 for impinging a cooling fluid on the array 130. The array 130 of cooling channels 132 may define the active cooling area 111 where the one or more semiconductor devices 180 are cooled. Embodiments are contemplated that do not include cooling channels 132 at the cooling area 111.

Still referring to FIGS. 1 and 2A, the array 130 may comprise a plurality of cooling cells 131 arranged in a pattern. The cooling cells 131 may be inter-connected through the one or more cooling channels 132 and each may comprise an impingement region 133 where cooling fluid is impinged as described in greater detail below. The array 130 may also include a cooling fluid drain 134 that forms a perimeter of the array 130. In some embodiments, the cooling fluid drain 134 may surround the entire array 130 of cooling channels 132. In other embodiments, each cooling cell 131 may comprise its own individual cooling fluid drain 134. The cooling fluid drain 134 may be in fluid communication with the cooling channels 132 and an outlet manifold 136 of the second layer 104. Cooling fluid may flow into the outlet manifold 136 from the drain 134 after impinging the cooling cells 131. The array 130 may be formed by a variety of manufacturing processes including, for example, silicon etching processes or similar processes to achieve the desired shape and configuration.

The cooling channels 132 may be defined by a plurality of heat transfer layer fins of different shapes and sizes. The cooling channels 132 may comprise curved walls and be geometrically optimized to reduce pressure drop, enhance heat transfer, and direct the cooling fluid toward a fluid outlet such as the cooling fluid drain 134. The geometric configuration of the cooling channels 132 may be determined by computer simulation, for example. The geometric configuration of the cooling channels 132 may depend on parameters such as flow resistance, the type of cooling fluid, and the desired maximum operating temperature of the semiconductor device 180.

Referring to FIGS. 1 and 2B, the second substrate layer 104 may include a top surface 112 and a bottom surface 114. In some embodiments, the top surface 112 of the second substrate layer 104 may be directly bonded to the bottom surface 110 of the first substrate layer 102. As used herein, the term "directly bonded" or a "direct bond" (also referred to as "silicon direct bonded" or "silicon fusion bonded") means a bond between layers of silicon substrate, such as the first substrate layer 102 and the second substrate layer 104, without an additional layer between the two layers. The silicon direct bond may be based on intermolecular interactions including van der Waals forces, hydrogen bonds and strong covalent bonds.

The outlet manifold 136 may be etched or otherwise fabricated in the top surface 112 of the second substrate layer 104. The example outlet manifold 136 includes an outlet 138. A bottom surface 110 of the first substrate layer 102 may form an upper boundary of the outlet manifold 136. The outlet 138 may be a hole etched through the entire thickness of the second substrate layer 104. The nozzle structure 126 of the illustrated embodiment is positioned on the second substrate layer 104 opposite the array 130 of cooling channels 132 on the first substrate layer 102. As shown in the inset of FIG. 2B, the nozzle structure 126 may include one or more nozzles 128 that pass through the width of the second substrate layer 104. The nozzles 128 may be integrally formed as hollow cylinders, for example. The one or more nozzles 128 may be formed by an etching or similar processes to achieve the desired shape and configuration. In the non-limiting example, the nozzle structure 126 is an array that includes twelve (12) nozzles in the longitudinal flow direction and six (6) nozzles in the direction that is transverse to the longitudinal flow direction. It should be understood that any number of nozzles may be provided.

Referring to FIG. 1, the third substrate layer 106 may include a top surface 116 and a bottom surface 118. In some embodiments, the top surface 116 of the third substrate layer may be directly bonded to the bottom surface 114 of the second substrate layer 104. An inlet manifold 122 may be etched in the top surface 116 of the third substrate layer 106 that includes an inlet 120 through the thickness of the third substrate layer 106. The bottom surface 114 of the second substrate layer 104 may form an upper boundary of the inlet manifold 122, thus containing cooling fluid within the cooling fluid flow path 101. Additionally, the inlet manifold 122 may be in fluid communication with the one or more nozzles 128 of the nozzle structure 126. The third substrate layer 106 also includes an outlet 140. The outlet 140 may be sized and shaped to correspond to the outlet 138 of the second substrate layer 104.

The bottom surface 118 of the third substrate layer 106 may comprise a bottom metallization trench 144 (not visible in FIG. 1) similar to the top metallization trench 143 in the top surface 108 of the first substrate layer 102. The bottom metallization trench 144 may house one or more metallization pads 142. The metallization pad 142 may be used to electrically couple the one or more semiconductor devices 180 to one or more other components as will be described in greater detail below. The top metallization trench 143 and the bottom metallization trench 144 may be electrically coupled using the one or more electrically conductive materials 145 disposed in the one or more TSVs 146.

Still referring to FIG. 1, the cooling structure 100 may include an array 170 of flow directing features within the inlet manifold 122 that conditions the flow of cooling fluid in the cooling fluid flow path 101. In some embodiments, the array 170 of flow directing features may comprise one or more micro-pillars 172 arranged in a pattern. The pattern of one or more micro-pillars 172 may affect the flow of the cooling fluid in one or more ways. For example, the pattern defined by the array 170 may reduce the velocity of the flow, make the flow more uniform through the nozzles 128, direct the flow, and/or increase the heat transfer capability of the cooling fluid flowing in the cooling structure 100.

The micro-pillars 172 may be etched into the third substrate layer 106 and may be arranged in a programmed sequence of columns and/or rows, such as, without limitation, two rows of six micro-pillars 172, as shown in FIG. 1. The micro-pillars 172 may be positioned within the cooling fluid flow path 101 between the inlet 120 and the inlet to the one or more nozzles 128 on the third substrate layer 106. In some embodiments, this position is within the inlet manifold 122. In some embodiments, the micro-pillars 172 may have a cylindrical external profile, but embodiments are not limited thereto. Other non-limiting examples of potential profile shapes include a square profile, a triangular profile, or an arbitrary profile. Additionally, in the example shown in FIG. 1, each of the micro-pillars 172 includes a uniform external profile, but embodiments are not limited thereto. It is contemplated that in some embodiments, one or more of the micro-pillars 172 may comprise an external profile that is distinct from one or more of the external profiles of the other micro-pillars 172. In some embodiments, the one or more micro-pillars 172 comprise a cylindrical profile.

The array 170 of flow directing features and/or micro-pillars 172 may be formed similarly to the other components of the cooling structure 100. For example, the array 170 of flow directing features may be chemically etched from the third substrate layer 106. The height of the one or more micro-pillars 172 may correspond to the height of the inlet manifold 122 so that there is no gap between the bottom surface 114 of the second substrate layer 104 and the tops of the micro-pillars 172. Because there may be no gap between the tops of the micro-pillars 172 and the bottom surface 114 of the second substrate layer 104, cooling fluid may not escape the inlet manifold 122 at the interface between the micro-pillars 172 and the second substrate layer 104.

Figure 4:
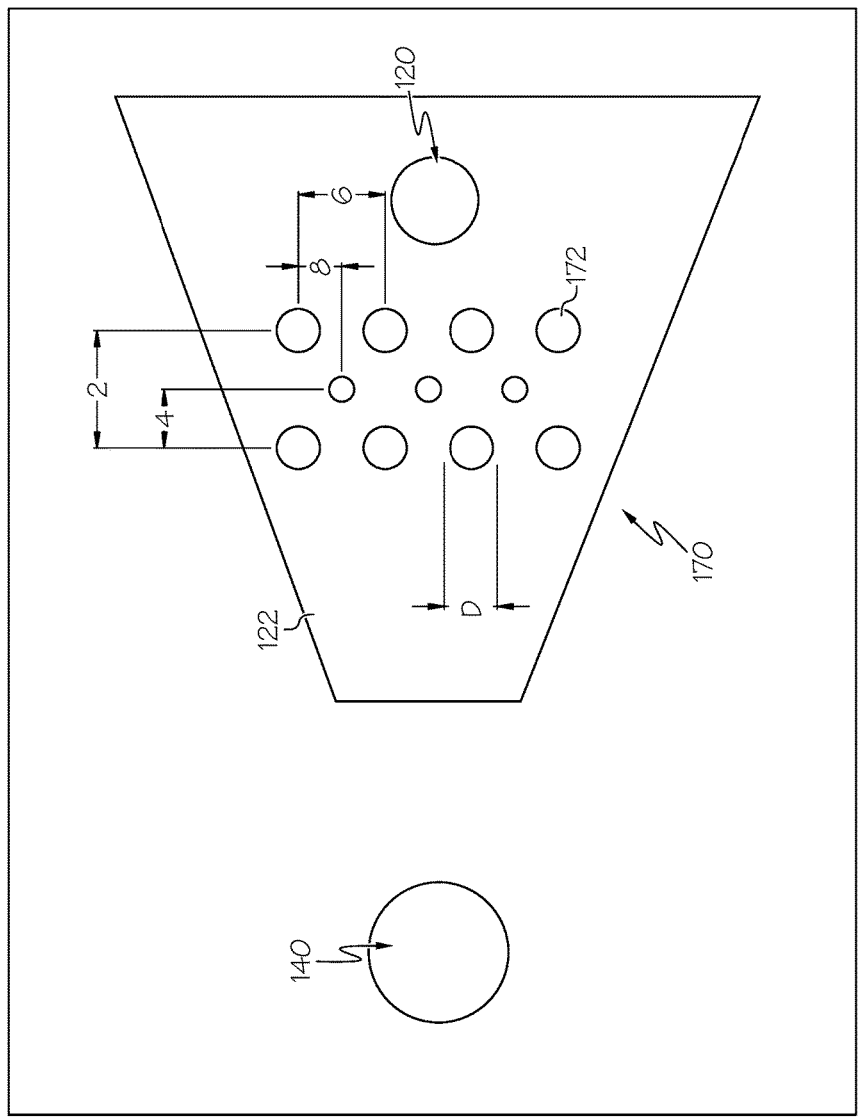
FIG. 4 depicts a schematic top view of a third substrate layer having a pattern of micro-pillars, according to one or more embodiments shown and described herein.

Referring now to FIGS. 1 and 4, the micro-pillars 172 may be formed in a pattern. Two non-limiting examples of patterns include a two-line straight array or a three-line staggered array. FIG. 1 shows the micro-pillars 172 in a two-line straight array while FIG. 4 shows the micro-pillars 172 in a three-line staggered array. The micro-pillars 172 may each have a diameter D. Each of the micro-pillars 172 may have the same diameter or different diameters. In some embodiments one or more groups of micro-pillars 172 have the same diameters while other groups of micro-pillars 172 have one or more different diameters. As a non-limiting example, the diameter D of the micro-pillars 172 may be between 50 and 250 micrometers. In some embodiments, the diameter D of the micro-pillars is between 75 and 225 micrometers. In some embodiments, the diameter D of the micro-pillars is between 100 and 200 micrometers. However, it is contemplated that embodiments are not limited to any particular diameter.

As shown in FIG. 4, in embodiments having one or more staggered rows of micro-pillars 172, there may be a major longitudinal pitch dimension 2, a minor longitudinal pitch dimension 4, a major transverse pitch dimension 6, and a minor transverse pitch dimension 8. In embodiments such as the one shown in FIG. 1, there may by only one longitudinal pitch dimension and one transverse pitch dimension (i.e., neither a major nor a minor dimension). Additionally, it is possible to arrange the micro-pillars 172 in non-uniform arrays or other patterns in which there is no set pitch between the individual micro-pillars 172 in the longitudinal or transverse directions.

The array 170 of flow directing features increases resistance to the flow of cooling fluid, lowering the momentum of the cooling fluid as it bends up and around the inlet 120. As shown in FIG. 1, the one or more micro-pillars 172 are between the inlet 120 and the nozzle structure 126 positioned on the bottom surface of the inlet manifold 122. The inlet 120 may be relatively wide, causing a small pressure drop in the flow of cooling fluid as it enters the inlet manifold 122. It may be advantageous to reduce the velocity of the flow by increasing the resistance in the flow path. By reducing the velocity of the cooling fluid flow, a lower percentage of the cooling fluid flowing in the inlet manifold 122 will reach the nozzles 128 that are near the back of the nozzle structure 126, instead flowing through the nozzles 128 that are located nearest to the inlet 120. This may result in a more uniform flow profile of cooling fluid flowing to the array 130 of cooling channels 132 and thus fewer hotspots or a better average temperature profile of the semiconductor device 180 that is cooled by the array 130 of cooling channels 132.

Referring again to FIG. 1, one or more of the micro-pillars 172 of the array 170 of flow directing features may include one or more third substrate layer through-holes 174. The third substrate layer through-holes 174 may be formed to include one or more TSVs 146. The third substrate layer through-holes 174 may be a hollow portion of the micro-pillar 172 that extends through the width of the third substrate layer 106 providing a clearance for the one or more electrically conductive materials 145 disposed in the one or more TSVs 146 to electrically connect the semiconductor device 180 through the metallization pads 142. The number of the one or more third substrate layer through-holes 174 may correspond to the number of TSVs 146; however, not each of the one or more third substrate layer through-holes 174 necessarily includes electrically conductive material. Similarly, not each of the one or more micro-pillars 172 may include a third substrate layer through-hole 174. Additionally, the second substrate layer 104 comprises one or more second substrate layer through-holes 176 and the first substrate layer 102 comprises one or more first substrate layer through-holes 178.

The third substrate layer through-holes 174 in the one or more micro-pillars 172 may be coaxial and coradial with the second substrate layer through-holes 176 on the second substrate layer 104 and the first substrate layer through-holes 178 on the first substrate layer 102. The first substrate layer through-holes 178 and the second substrate layer through-holes 176 may be etched similarly to the other structures of the cooling structure 100. The radii of the third substrate layer through-holes 174, the second substrate layer through-holes 176, and the first substrate layer through-holes 178 may be substantially equivalent. Additionally, the through-holes 174, 176, 178 may be metallized through all layers of the cooler structure 100 as described in greater detail below.

Referring to FIGS. 1, 2A, and 2B, the cooling fluid flow path 101 will now be described. Cooling fluid may generally flow along the cooling fluid flow path 101 from the inlet 120, to the inlet manifold 122, along the inlet manifold 122, where it may be directed by the array 170 of micro-pillars 172, in a longitudinal direction to the one or more nozzles 128 of the nozzle structure 126 where it may be impinged on the one or more cooling channels 132 of the array 130.

The flow velocity profile in the flow path containing an array such as the array 170 of flow directing features is flatter than a flow velocity profile that does not contain a flow directing feature, that is the magnitude of the variance in flow velocities at the inlet to each of the individual nozzles is lower in flow paths that include the array 170. Specifically, the normalized flow velocity at the rear of the nozzle structure (as the cooling fluid flows in the longitudinal direction) is flatter in an embodiment containing an array of flow directing features, such as the array 170, than in an embodiment that does not include such an array. Hence, the flow velocity profile across the entire nozzle structure is flatter. A flatter flow velocity profile is the result of a lower flow momentum that results from the inclusion of the array 170 of flow directing features.

After impingement on the one or more cooling channels 132, the cooling fluid may flow to the cooling fluid drain 134 where it then enters the outlet manifold 136. The cooling fluid may then flow out the outlets 138, 140 where it may connect to another system or be recirculated. For example, in some embodiments, the warmed cooling fluid may be cooled in a secondary recirculation loop, such as an automotive radiator or be stored in a cooling fluid reservoir. The cooling structure 100 may include a micropump or some other mechanism for imparting a pressure differential in the cooling fluid flow path 101 thus causing the cooling fluid to flow through the various components as described herein.

In operation, cooling fluid flows between the one or more micro-pillars 172 of the array 170 of flow directing features. The micro-pillars 172 create disruptions in the otherwise laminar flow of the cooling fluid. The bottom surface 114 of the second substrate layer 104 and the surfaces of the inlet manifold 122 create a microchannel. The cooling fluid flow in this microchannel may deform as it passes the one or more micro-pillars 172. This may create one or more recirculations in the cooling fluid flow or reduce the momentum of the flow as it passes through the pattern of one or more micro-pillars 172.

As described above, cooling fluid may be impinged on the one or more impingement regions 133 of the array 130 shown in FIG. 2A as a jet flowing upward from the one or more nozzles 128 shown in FIG. 2B after passing through the inlet 120 and inlet manifold 122 shown in FIG. 1. In some embodiments, the cooling fluid may change phases while passing through the one or more nozzles 128 or after it has impinged on the one or more cooling cells 131. In some embodiments, the nozzles 128 have a linear nozzle flow velocity profile. In other embodiments, the nozzles 128 have a convergent-divergent profile, a divergent-convergent-divergent profile, or any other suitable nozzle flow velocity profile. In alternative embodiments, the cooling fluid flow path 101 does not include a nozzle structure 126. That is, the cooling structure 100 may not be configured as a jet impingement heat exchanger but rather as a channel-only structure wherein fluid entering the cooling channels 132 would flow around heat exchanger fins of one or more heat transfer layers. In such embodiments, there may be one or more holes through the second substrate layer 104.

After the cooling fluid is impinged on the impingement region 133 of each cooling cell 131, it remains in contact with the array 130 but changes direction to a flow direction that is normal to the jet of cooling fluid. The cooling fluid may flow radially from the center of each cooling cell 131 toward the perimeter of the cooling cell 131 through the cooling channels 132, ultimately reaching the cooling fluid drain 134. Therefore, the cooling fluid may flow over the surface of the array 130 convectively and conductively transferring heat flux from the semiconductor device 180 to the cooling fluid, simultaneously heating the cooling fluid and cooling the semiconductor device 180.

The cooling fluid may comprise, as one example, deionized water. Other exemplary fluids include, without limitation, water, organic solvents, and inorganic solvents. Examples of such solvents may include commercial refrigerants such as R-134a, R717, and R744. Moreover, in some embodiments, the cooling fluid may be a dielectric cooling fluid. Non-limiting dielectric cooling fluids include R-245fa and HFE-7100. The type of cooling fluid chosen may depend on the operating temperature of the one or more semiconductor devices 180 to be cooled. Further, selection of the composition of the cooling fluid used in association with the cooling structure 100 may be based on, among other properties, the boiling point, the density, and/or the viscosity of the cooling fluid. In some embodiments, the cooling fluid may change phase (i.e., from a liquid to a gas) as it passes through the nozzle structure 126 or once it has been impinged on the one or more cooling cells 131. In such embodiments, the cooling fluid may be selected for its thermodynamic properties, such as latent heat of vaporization.

In operation, semiconductor devices, such as the semiconductor device 180, generate heat. Because the semiconductor device 180 is thermally coupled to the cooling structure 100, the heat generated by the semiconductor device 180 will conduct to the cooling structure 100. In the embodiments shown and described herein, the heat flux generated by the one or more semiconductor devices 180 coupled to the top surface 108 of the first substrate layer 102 may be conducted to the array 130 of cooling channels 132 through the first substrate layer 102.

In some embodiments, the first substrate layer 102 may comprise one or more structures between the array 130 and the one or more semiconductor devices 180 to provide electrical connection and/or alter the thermal resistance between the array 130 and the one or more semiconductor devices 180. For example, the metallization pad 142 may be placed between the one or more semiconductor devices 180 and the array 130. The metallization pad 142 may exhibit a relatively high heat transfer coefficient. Other devices or layers may be placed between the semiconductor device and the array 130 of cooling channels 132 to manipulate the heat transfer properties from the semiconductor device 180. For example, a layer of thermal interface material (TIM) may be placed between the semiconductor device 180 and the array 130 to increase the amount of heat transferred to the array 130. A layer of TIM may be placed between the semiconductor device 180 and the metallization pad 142 or between the metallization pad 142 and the array 130. Any type of TIM may be used, for example thermal grease, thermal glue, thermal gap filler, a thermal pad, and/or a thermal adhesive. The metallization pad 142 and/or TIM between the semiconductor device 180 and the array 130 may reduce the heat transfer resistance between the semiconductor device 180 and the cooling fluid, allowing more heat to be convected to the cooling fluid passing through the array 130, thus reducing the overall temperature of the semiconductor device 180.

The semiconductor device 180 may comprise one or more hot spots (i.e., regions of higher temperature as compared to other regions within the semiconductor device 180) based on the particular construction of the individual semiconductor device 180. One or more of the impingement regions 133 may coincide with one or more hot spots one the semiconductor device 180 such that these areas of the one or more semiconductor devices 180 receive the impingement of cooling fluid and are thus cooled at a greater rate improving the performance of the one or more semiconductor devices 180.

After leaving the array 130 of cooling cells 131, the cooling fluid may exit the cooling structure 100 through the outlet manifold 136 and the outlets 138, 140. The cooling fluid may then be circulated through one or more other systems, such as, for example, one or more other cooling structures 100 or other heat exchanger, or sent to a cooling fluid reservoir.

Still referring to FIG. 1, in some embodiments, the electrically conductive material 145 disposed in the one or more TSVs 146 may electrically couple a first metallization pad 142 in the top metallization trench 143 of the first substrate layer 102 with a second metallization pad 142 of the bottom metallization trench 144. The electrically conductive material 145 may carry electrical current from a semiconductor device on one side of the cooling structure to a semiconductor device on the other side of the cooling structure; laterally through the metallization pads 142 and vertically through the electrically conductive material 145.

Figure 5:
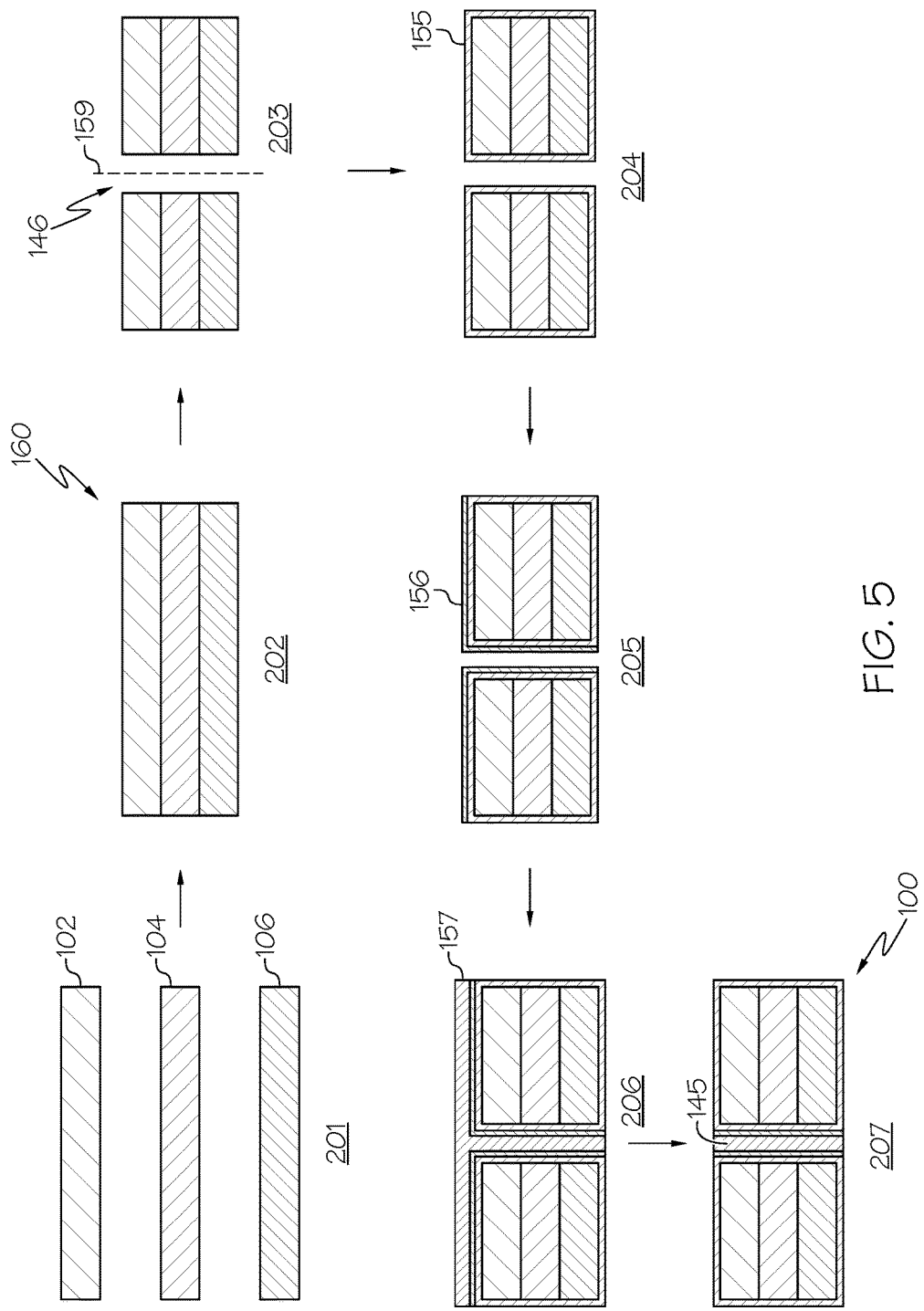
FIG. 5 depicts a flow chart for bonding one or more substrates to fabricate a cooling structure, according to one or more embodiments shown and described herein.

Referring to FIGS. 1 and 5, an example, non-limiting process for fabrication of the cooling structure 100 will be described. The cooling structure 100 may be formed by directly bonding the first, second, and third substrate layers 102, 104, 106. The first, second, and third substrate layers 102, 104, 106 of the cooling structure 100 may be directly bonded as described above.

The fluid channels and other flow structures of the cooling structure 100 may be formed by etching using a chemical etchant. For example, the inlet 120, inlet manifold 122, one or more nozzles 128, cooling channels 132, cooling fluid drain 134, outlet manifold 136, outlet 138, and outlet 140 may be formed by etching the first, second, and third substrate layers 102, 104, 106. Further, the cooling channels 132 may comprise uniform pin fin arrays, non-uniform pin fin arrays, straight channels, wavy channels, or channels comprising any cross-sectional shape, pathway shape, or pathway topology that are etched into the various substrate layers of the cooling structure 100.

In some embodiments, the third substrate layer through-holes 174, the second substrate layer through-holes 176, and the first substrate layer through-holes 178 may be aligned along one or more through-hole axes 159 to form the one or more TSVs 146. The TSVs 146 may thus comprise a through-hole through all three substrate layers 102, 104, 106. The one or more TSVs 146 may be metallized through one or more metallization processes as described below and illustrated in FIG. 5 to provide the one or more electrically conductive materials 145.

As shown in FIG. 5, the first, second, and third substrate layers 102, 104, 106 may be arranged at step 201 and bonded together at step 202. One or more of the other features of the cooling structure 100 may be formed in the individual layers of the cooling structure 100 before, after, or concurrently with the steps described herein. For example, the top metallization trench 143 (see FIG. 1) may be etched in the first substrate layer 102 before, during, or after the steps described with reference to FIG. 5.

In some embodiments, after the first, second, and third substrate layers 102, 104, 106 are bonded, a high aspect ratio etch may be performed on the cooling structure 100 to form the one or more TSVs 146 at step 203. The etch may be made by any chemical or mechanical etching process. The one or more substrate layers 102, 104, 106, including the TSVs 146 may then be coated with an insulation layer 155 at step 204. After the insulation layer 155 is applied, a seed layer 156 may be applied at step 205. A metallization layer 157 is then applied over the seed layer at step 206. The metallization layer 157, seed layer 156, and the insulation layer 155 may be deposited using any deposition technique such as sputtering, atomic layer deposition (ALD), chemical vapor deposition (CVD), physical vapor deposition (PVD), such as PVD magnetron sputtering, etc. Once the metallization layer 157 is applied, excess metallization may be polished away using a chemical-mechanical polish at step 207, leaving the one or more electrically conductive materials 145.

In other embodiments, the first, second, and third substrate layers 102, 104, 106 may be coupled and etched in an order distinct from that discussed above. For example, the one or more TSVs 146 may be etched in each substrate layer before the substrate layers are bonded or otherwise joined together, then aligned, then metallized as discussed above. Other orders of performing the steps for fabricating the cooling structure are contemplated without limitation.

Figure 3:
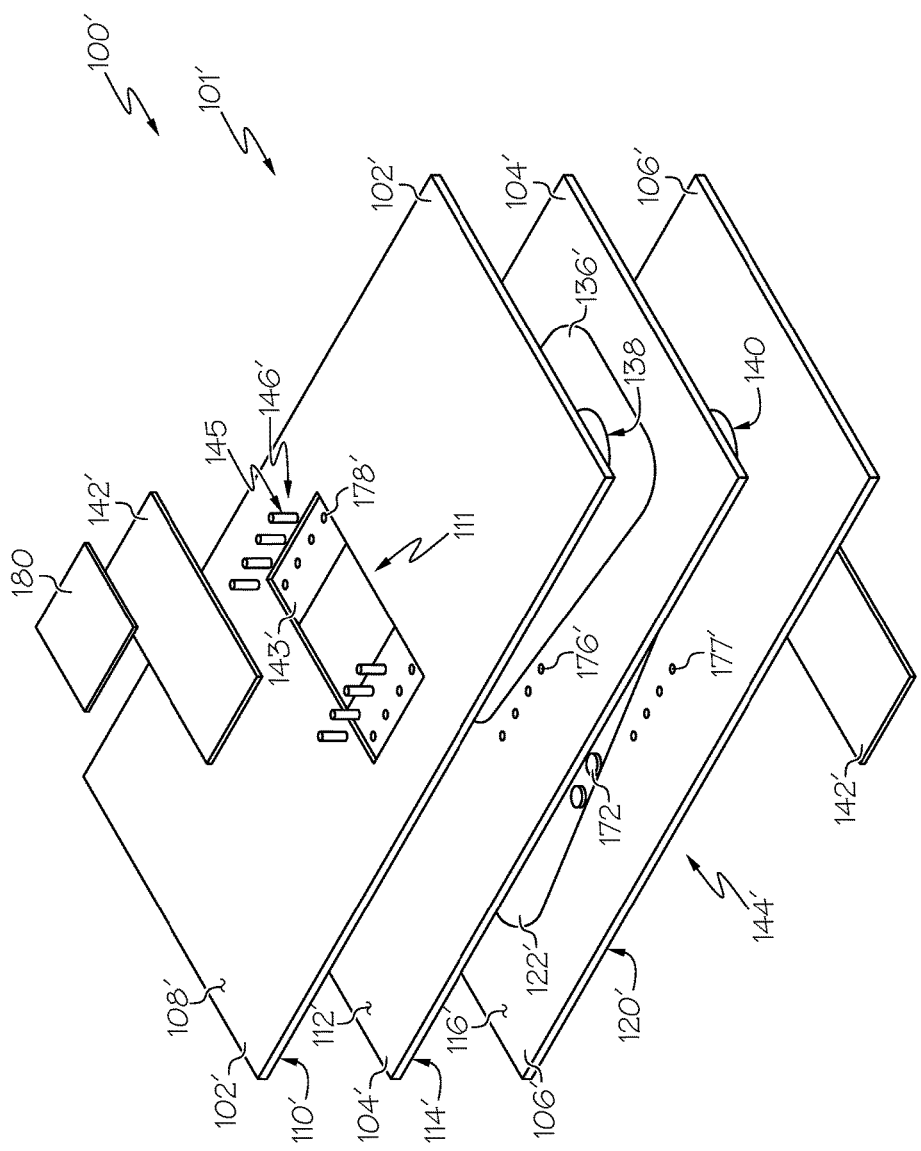
FIG. 3 depicts the cooling structure of FIG. 1 having TSVs outside a cooling manifold, according to one or more embodiments shown and described herein.

Referring now to FIG. 3, an example cooling structure 100' wherein one or more electrically conductive materials 145 disposed in one or more TSVs 146' that are positioned outside of a cooling fluid flow path 101' is schematically illustrated. The example cooling structure 100' having one or more TSVs 146' disposed outside the cooling fluid flow path 101' is merely an example and alternative embodiments are possible. The cooling structure 100' may include a first substrate layer 102', a second substrate layer 104', and a third substrate layer 106'. In embodiments, the first, second, and third substrate layers 102', 104', and 106' are fabricated from silicon. The first substrate layer 102' may include a top surface 108' and a bottom surface 110'. In the illustrated embodiment, a metallization trench 143' is provided in the top surface 108' of the first substrate layer 102'. A metallization pad 142' is disposed within the metallization trench 143'. The top metallization trench 143' may be etched into the top surface 108' for receiving the metallization pad 142'. As described above, the metallization pad 142' electrically couples a bottom surface of the one or more semiconductor devices 180 to one or more electrically conductive materials 145 disposed in the one or more TSVs 146' through the metallization trench 143'. The metallization pad 142' may be fabricated from an electrically conductive material such as, without limitation, copper. The one or more semiconductor devices 180 are disposed on the metallization pad 142'.

There may or may not be micro-pillars 172 or other features for directing flow within the features that make up the cooling fluid flow path 101', such as the inlet manifold 122'. In the embodiment shown in FIG. 2, the first substrate layer through-holes 178', the second substrate layer through-holes 176', and third substrate layer through-holes 177' that make up the TSVs 146' (shown in FIG. 5) are etched alongside the inlet manifold 122' and the outlet manifold 136'. The TSVs 146' may be metallized as described above to form the one or more electrically conductive materials 145 outside the cooling fluid flow path 101'. Removing the TSVs 146' from the cooling fluid flow path 101' may increase flow within the inlet manifold 122' and/or reduce the resistance to the cooling fluid flow within the inlet manifold 122'. Additionally, removing the one or more TSVs 146' from the cooling fluid flow path 101' may ease alignment tolerances easing overall fabrication difficulty and increasing electrical connectivity.

In such an embodiment, the metallization pads 142' may be turned ninety-degrees as compared to the embodiment depicted in FIG. 1, or otherwise be reconfigured to extend laterally between the TSVs 146' in order to carry current from the metallization pad 142' on the bottom of the cooling structure 100' to the metallization pad 142' on the top of the cooling structure 100' or vice-a-versa.

Other arrangements of the position of the one or more TSVs 146 or TSVs 146' are possible. For example, in some embodiments there may be TSVs both inside and outside the cooling fluid flow path 101'. Such an arrangement may impart the flow characteristics described above while also allowing current to be passed outside of the cooling fluid flow path 101', thus increasing electrical connectivity through the multiple layers of the cooling structure.

It should now be understood that embodiments are directed to cooling structures having one or more flow directing features that may present advantageous characteristics. As described above, a flow directing feature may balance the cooling fluid flow within the structure, causing cooling fluid to flow more evenly to each of the nozzles within a nozzle structure resulting in a more uniform flow distribution when the cooling fluid is impinged on an array of cooling channels. This may result in greater cooling characteristics of one or more semiconductor or other heat generating devices cooled by the cooling structure. Additionally, the one or more micro-pillars of the flow directing feature may provide a convenient location for forming one or more TSVs for electrically coupling the one or more semiconductor devices across the cooling structure, enabling efficient fabrication and effective cooling in the same package. Even more, incorporation of TSVs in the chip-scale cooling structure enables the cooling fluid to be nearer to the semiconductor device, removing greater amounts of heat and improving operating characteristics of the semiconductor device.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A cooling structure comprising:
    a first substrate layer comprising an array of cooling channels, a cooling fluid drain, and one or more first substrate layer through-holes;
    a second substrate layer comprising a nozzle structure, an outlet manifold, an outlet, and one or more second substrate layer through-holes; and
    a third substrate layer comprising an inlet, an inlet manifold, one or more flow directing features disposed within the inlet manifold, and one or more third substrate layer through-holes, wherein:
        the first substrate layer through-holes, second substrate layer through-holes, and third substrate layer through-holes form one or more TSVs through the first, second, and third substrate layers, and
        one or more electrically conductive materials are disposed within the one or more TSVs.

2. The cooling structure of claim 1, wherein a first metallization pad is disposed on a top surface of the first substrate layer and a second metallization pad is disposed on a bottom surface of the third substrate layer.

3. The cooling structure of claim 2, wherein the first metallization pad and the second metallization pad are electrically coupled through the electrically conductive material disposed in the one or more TSVs.

4. The cooling structure of claim 3, wherein third substrate layer through-holes are disposed in the one or more flow directing features.

5. The cooling structure of claim 4, wherein a top metallization trench is disposed on the top surface of the first substrate layer and a bottom metallization trench is disposed on the bottom surface of the third substrate layer and the first metallization pad is disposed in the top metallization trench and the second metallization pad is disposed in the bottom metallization pad.

6. The cooling structure of claim 3, wherein the third substrate layer through-holes are outside the inlet manifold, such that the one or more TSVs are outside of the flow directing features.

7. The cooling structure of claim 6, wherein the one or more flow directing features comprise an array of one or more micro-pillars.

8. The cooling structure of claim 7, wherein the one or more micro-pillars are arranged in an array of two rows of micro-pillars.

9. The cooling structure of claim 3, wherein the third substrate layer through-holes are disposed in the one or more flow directing features and outside the inlet manifold.

10. The cooling structure of claim 3, wherein a bottom surface of the first substrate layer is directly bonded to a top surface of the second substrate layer and a bottom surface of the second substrate layer is directly bonded to a top surface of the third substrate layer.

11. A cooling structure comprising:
a first substrate layer comprising an array of cooling channels;
a second substrate layer comprising a nozzle structure, an outlet manifold, and an outlet;
a third substrate layer comprising an inlet, and inlet manifold, and one or more flow directing features disposed within the inlet manifold; wherein:
the one or more flow directing features comprise one or more micro-pillars extending into the cooling fluid flow path from the inlet manifold,
the first substrate layer comprises one or more first substrate layer through-holes, the second substrate layer comprises one or more second substrate layer-through holes, and the third substrate layer comprises one or more third-substrate layer through holes, and
the first substrate layer through-holes, the second substrate layer through-holes, and the third substrate layer through-holes are aligned into one or more TSVs and metallized.

12. The cooling structure of claim 11, wherein the one or more flow directing features comprise three staggered rows of micro-pillars.

13. The cooling structure of claim 11, wherein the one or more micro-pillars comprise a cylindrical profile.

14. The cooling structure of claim 11, wherein the one or more flow directing features comprise two rows of micro-pillars.

15. The cooling structure of claim 11, wherein a semiconductor device is cooled by cooling fluid flowing in the cooling fluid flow path and the semiconductor device is thermally coupled to the array of cooling channels at an active cooling area.

16. The cooling structure of claim 11, wherein the TSVs are outside the cooling fluid flow path.

17. The cooling structure of claim 11, wherein TSVs are disposed inside the cooling fluid flow path and outside the cooling fluid flow path.

18. A cooling structure comprising:
a first substrate layer comprising a top surface and a bottom surface, an array of cooling channels and a cooling fluid drain disposed on the bottom surface, and one or more first substrate layer through-holes;
a second substrate layer comprising a top surface and a bottom surface, a nozzle structure and an outlet manifold disposed on the top surface, an outlet, and one or more second substrate layer through-holes; and
a third substrate layer comprising a top surface and a bottom surface, an inlet manifold and one or more flow directing features disposed within the inlet manifold disposed on the top surface, and an inlet and one or more third substrate layer through-holes; wherein:
the first substrate layer through-holes, second substrate layer through-holes, and third substrate layer through-holes form one or more TSVs through the first, second, and third substrate layers,
one or more electrically conductive materials are disposed within the one or more TSVs,
the one or more third substrate layer through-holes are disposed in the one or more flow directing features in the inlet manifold, and
the one or more flow directing features comprise one or more micro-pillars.

19. The cooling structure of claim 18, wherein the one or more micro-pillars comprise a cylindrical profile.

20. The cooling structure of claim 18, wherein the third substrate layer through-holes are also disposed outside the inlet manifold.

* * * * *